(12) United States Patent
Lee

(10) Patent No.: US 6,232,181 B1
(45) Date of Patent: May 15, 2001

(54) METHOD OF FORMING A FLASH MEMORY

(75) Inventor: Claymens Lee, Kaohsiung Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/422,625

(22) Filed: Oct. 21, 1999

(51) Int. Cl.[7] .................................................. H01L 21/336
(52) U.S. Cl. ......................... 438/257; 438/262; 438/266; 438/424; 438/427
(58) Field of Search .................................. 438/257, 259, 438/262, 266, 299, 422, 424, 425, 426, 427, 450, 589

(56) References Cited

U.S. PATENT DOCUMENTS 6,048,788 * 4/2000 Ding et al. ............................ 438/264
6,100,161 * 8/2000 Yu et al. ............................... 438/424
6,150,234 * 11/2000 Olsen ................................... 438/424
6,171,909 * 8/2000 Ding et al. ............................ 438/267

* cited by examiner

*Primary Examiner*—Charles Bowers
*Assistant Examiner*—Jack Chen
(74) *Attorney, Agent, or Firm*—Thomas, Kayden, Horstemeyer & Risley

(57) ABSTRACT

A method of forming flash memory. The method includes forming buried bit lines before the production of shallow trench isolation (STI) structures. The steps for producing the STI structures include forming a pad oxide layer and a silicon nitride layer. A plurality of openings that expose the pad oxide layer is formed in the silicon nitride layer. These openings are located directly above the buried bit lines. Silicon dioxide is deposited to form a silicon dioxide layer that fills these openings. The silicon dioxide layer is capable of preventing the buried bit lines from being cut into segments in subsequent trench-isolation operations.

8 Claims, 3 Drawing Sheets

METHOD OF FORMING A FLASH MEMORY

BACKGROUND OF THE INVENTION

1. Field of Invention

The present invention relates to a method of forming a flash memory. More particularly, the present invention relates to a method of forming the shallow trench isolation (STI) structures and buried bit lines of flash memory.

2. Description of Related Art

Shallow trench isolation (STI) is an important technique for isolating small dimensional devices on a silicon chip. However, forming STI structures on a substrate with buried N+ bit lines is no easy operation. There are two main reasons:

1. The buried bit lines and the active regions are perpendicular to each other; and,
2. If the buried bit lines are formed before etching out the trenches of STI structures, each continuous buried bit line will be cut into multiple segments.

Since the active regions and the buried bit lines are mutually perpendicular, the silicon nitride hard mask layer for patterning the active region and etching out trenches generally consists of a plurality of silicon nitride lines with portions of each buried bit line exposed. If the silicon nitride hard mask is used as an etching mask for producing the trenches, the buried bit lines will be cut into several discontinuous segments so that the original function of conducting an electric current is lost.

SUMMARY OF THE INVENTION

The present invention provides a method capable of producing the plurality of bit lines, the gate oxide layer and the gate structures of a flash memory.

To achieve these and other advantages and in accordance with the purpose of the invention, as embodied and broadly described herein, the invention provides a method of forming flash memory. A silicon substrate is first provided. A pad oxide layer is formed over the substrate. A plurality of silicon nitride lines parallel to each other is formed over the pad oxide layer. The silicon nitride lines have a plurality of openings that expose the pad oxide layer. Using the silicon nitride lines as a mask, ions are implanted into the substrate via the openings to form a plurality of bit lines. Silicon dioxide is next deposited into the openings to form a silicon dioxide layer that fills the openings and covers the plurality of bit lines. A photoresist layer is formed over the silicon nitride lines and the silicon dioxide layer. The photoresist layer is patterned to form a plurality of mutually parallel lines in a direction perpendicular to the silicon nitride lines. Using the photoresist lines as a mask, the silicon nitride lines, the pad oxide layer and the substrate are etched to form a plurality of trenches between the bit lines. Oxide plugs are next formed in the trenches, and then the silicon nitride lines and the pad oxide layer are removed sequentially. Finally, a gate oxide layer is formed over the aforementioned gate structures.

In this invention, lines of protective silicon dioxide are formed over the buried bit lines before the trench-forming step is carried out. Hence, the buried bit lines are still capable of conducting a current after STI structures are formed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
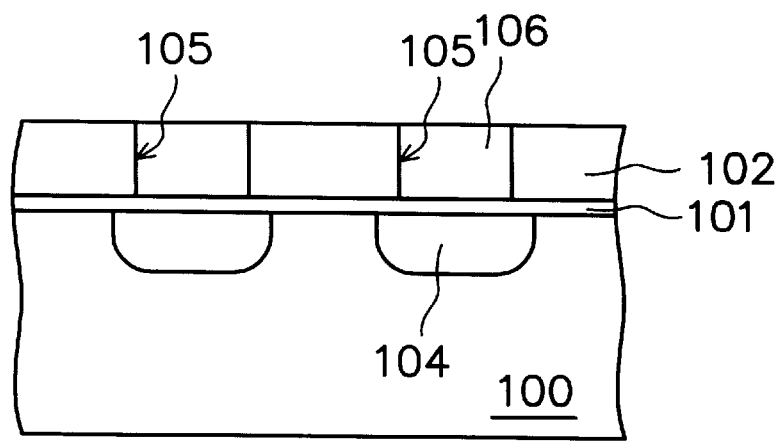
FIGS. 1A through 1C are schematic cross-sectional views showing the progression of manufacturing steps for producing a flash memory according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
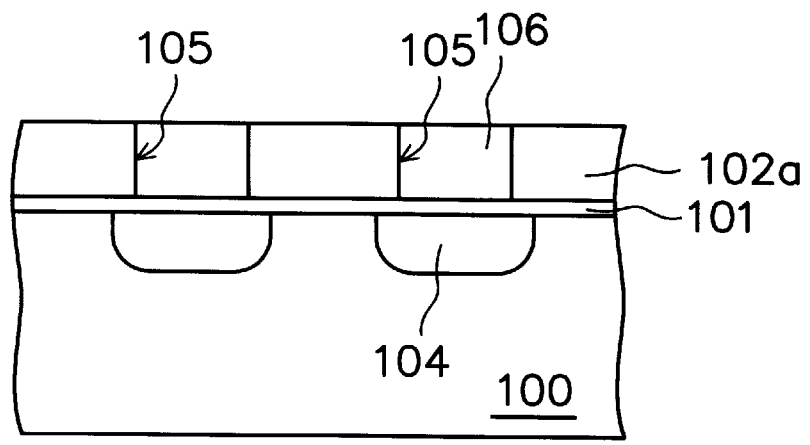
Figure 1C:
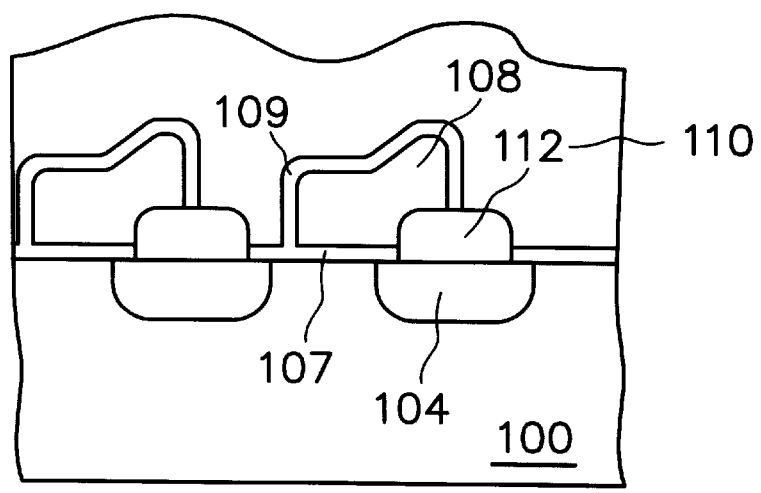
Figure 2:
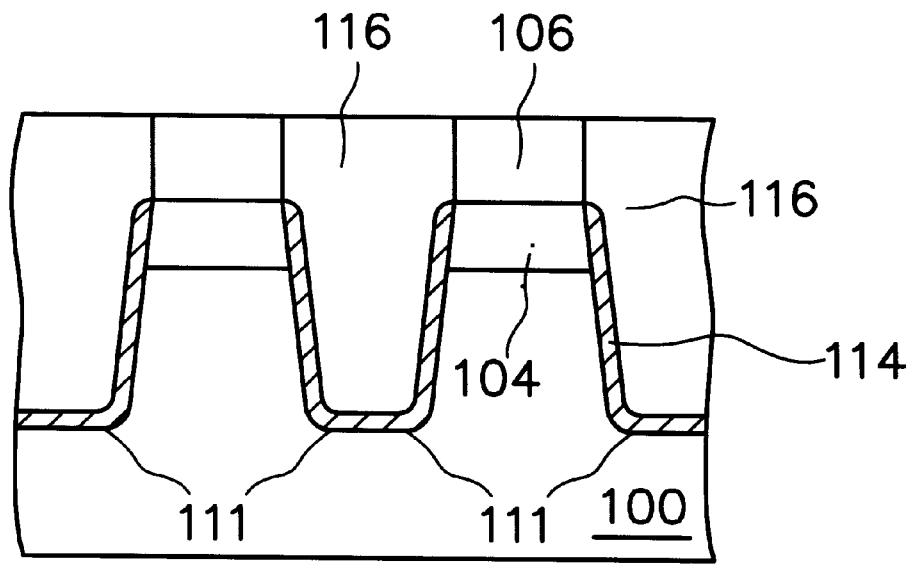
FIG. 2 is a schematic cross-sectional view cut along line II—II of FIG. 4B.
Figure 3:
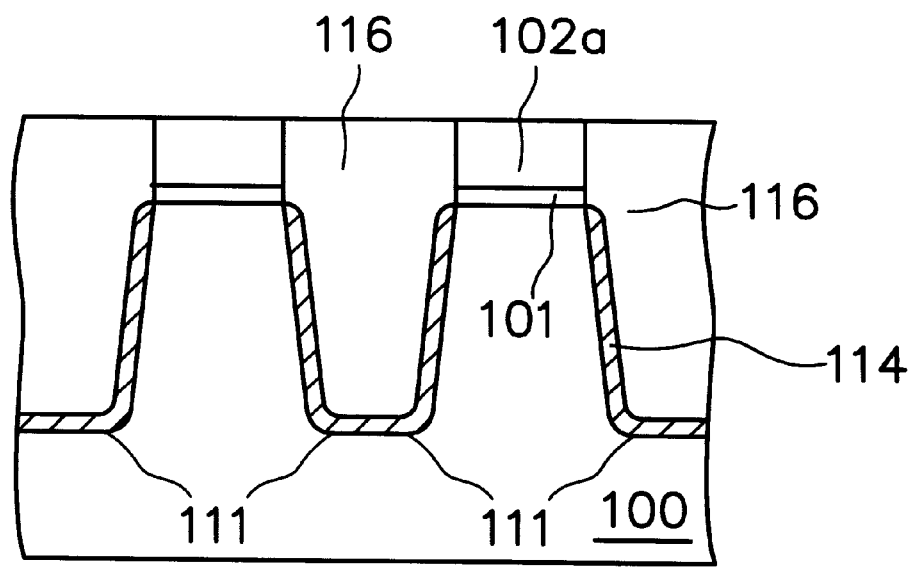
FIG. 3 is a schematic cross-sectional view cut along line III—III of FIG. 4B.
Figure 4A:
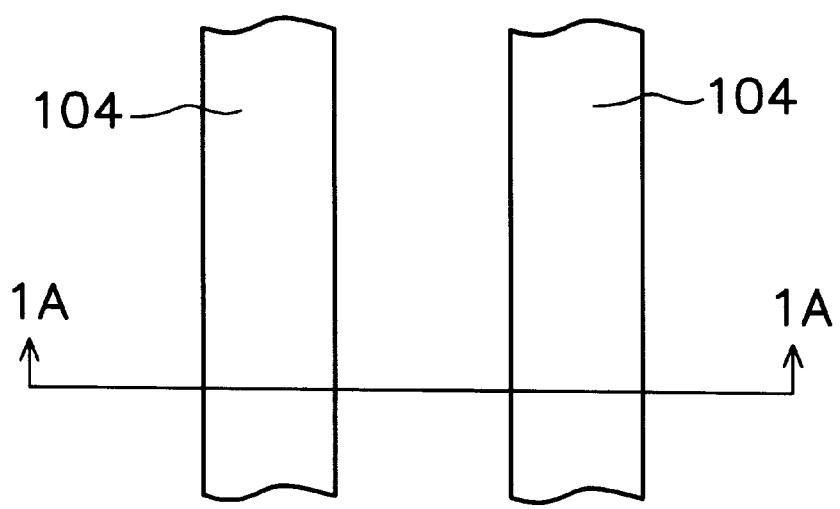
FIG. 4A is a schematic top view of the structure shown in FIG. 1A.
Figure 4B:
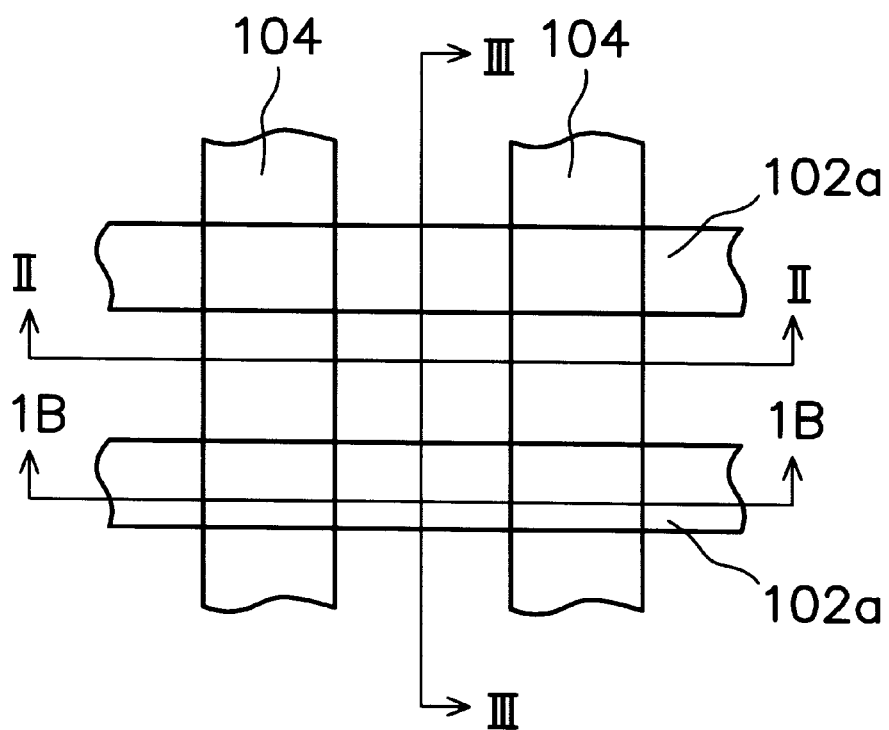
FIG. 4B is a schematic top view of the structure shown in FIG. 1B.

FIGS. 1A through 1C are schematic cross-sectional views showing the progression of manufacturing steps for producing a flash memory according to one preferred embodiment of this invention. FIG. 4A is a schematic top view of the structure shown FIG. 1A while FIG. 4B is a schematic top view of the structure shown in FIG. 1B. In FIG. 4B. the schematic cross-sectional view cut along line II—II is shown in FIG. 2 while the schematic cross-sectional view cut along line III—III is shown in FIG. 3.

As shown in FIG. 1A and 4A, a pad oxide layer 101 having a thickness of about 110 Å is formed over a silicon substrate 100 by thermal oxidation, for example. A silicon nitride layer (not entirely shown) having a thickness of about 2000 Å is formed over the pad oxide layer 101. A patterned photoresist layer (not shown) is formed over the silicon nitride layer. Using the patterned photoresist layer as a mask and the pad oxide layer as an etching stop layer, the silicon nitride layer is etched to form a patterned silicon nitride layer 102. The patterned silicon nitride layer 102 actually consists of a plurality of mutually parallel lines covering a portion of the pad oxide layer 101. These silicon nitride lines contain a plurality of openings 105 that expose the pad oxide layer 101. The patterned photoresist layer is removed, and then ions are implanted into the substrate 100 through the openings 105 in the silicon nitride layer 102 to form a plurality of buried bit lines 104. The implantation can be carried out using arsenic ions activated to an energy level of about 50 KeV. Silicon dioxide is deposited to fill the openings 105 of the patterned silicon nitride layer 102, completely forming a silicon dioxide layer 106. The silicon dioxide layer 106 can be formed by, for example, chemical vapor deposition. Redundant silicon dioxide above the silicon nitride layer 102 is removed by chemical-mechanical polishing (CMP).

The series of steps described above should be regarded as an example only. Any variation within each step, the addition or deletion of any steps and various combinations of the steps are permitted as long as they are within the scope of this invention. For example, the silicon nitride layer 102 can be replaced by other hard mask material. In fact, as long as a silicon dioxide layer 106 is formed over the buried bit lines 104 before performing any trench-forming operation, any variation should be regarded as within the spirit of this invention. The silicon dioxide layer 106 is capable of protecting the buried bit lines 104 against the cutting effect of etchant in a subsequent trench-forming operation.

FIGS. 1B, 2, 3 and 4B all serve to illustrate the trench-etching process of this invention. First, a patterned photoresist layer (not shown) is formed over the silicon nitride layer 102. The patterned photoresist layer actually consists of a plurality of parallel lines perpendicular to the silicon nitride layer 102 (FIG. 1A). Using these photoresist lines as a mask, the silicon nitride layer 102, the pad oxide layer 101 and the silicon substrate 100 are etched sequentially to form a plurality of trenches 111. Depth of each trench 111 is about 0.4 $\mu$m. The patterned photoresist layer is removed after the trench-forming process.

As shown in FIG. 1A and 1B, there is no structural difference before and after the trench-forming process. However, according to FIG. 4B, the silicon nitride layer 102a that remains after the etching operation is perpendicular to the buried bit lines 104. In fact, the silicon nitride layer 102a and the silicon oxide layer 106 are perpendicular to each other but both are at the same height level. In addition, one major characteristic of the invention is that a patch of silicon dioxide instead of silicon nitride covers the cross-junction between the silicon nitride layer 102a and the silicon oxide layer 106. Since the cross-junction area is covered by silicon dioxide, the etching of silicon nitride during a trench-forming operation does not lead to the exposure of the buried bit lines 104 (etchant for etching silicon nitride has a lower etching rate for silicon dioxide, and hence is comparatively unable to etch into the protective silicon dioxide layer 106 above the buried bit line 104). Furthermore, the buried bit line 104 in the cross-junction area will also be protected by the silicon dioxide layer from any attack in a subsequent substrate-etching operation.

In the subsequent step, oxide plugs are formed inside the trenches 111. To form the oxide plugs, a liner oxide layer 114 that conforms to the interior profile of the trenches 111 is formed by thermal oxidation. Silicon dioxide is next deposited to form a silicon dioxide layer 116 that fills the trenches 111 and covers the silicon nitride layer 102a. The silicon dioxide layer 116 inside the trenches 111 can be an atmospheric-TEOS (AP-TEOS) layer. The silicon dioxide layer 116 is subsequently densified and any excess silicon dioxide above the silicon nitride layer 102a is removed by chemical-mechanical polishing.

In the subsequent manufacturing process, the conventional split-gate flash memory manufacturing technique is used.

First, the silicon nitride layer 102a and the pad oxide layer 101 are sequentially removed by, for example, wet etching. A sacrificial oxide layer is grown over the substrate 100, and then the oxide layer is removed.

In the process of removing the silicon nitride layer 102a and the pad oxide layer 101, a portion of the silicon dioxide layer 106 on top of the buried bit line 104 may also be removed. Preferably, the silicon dioxide layer 106 should be completely removed, but even if some portion of the silicon dioxide layer 106 remains as shown in FIG. 1C, subsequent operations for forming the flash memory will not be affected.

As shown in FIG. 1C, a first gate oxide layer 107 conformal to the substrate profile is formed. A first polysilicon layer 108 and a patterned photoresist layer (not shown) are sequentially formed over the first gate oxide layer 107. Using the patterned photoresist layer as a mask, the first polysilicon layer 108 and the first gate oxide layer 107 are etched. The patterned photoresist layer is subsequently removed.

A second gate oxide layer 109 conformal to the substrate profile is formed, and then a second polysilicon layer 110 and another patterned photoresist layer (not shown) are sequentially formed over the second gate oxide layer 109. Using the patterned photoresist layer as a mask, the second polysilicon layer 110, the second gate oxide layer 109 and the first polysilicon layer 108 (if the first polysilicon layer 108 still has not been patterned into a floating gate) are sequentially etched to form a complete flash memory.

The split-gate flash memory manufacturing technique is chosen as an example only. Hence, the technique should not be used to limit the scope of this invention. The concept behind the technique is to form a split-gate structure necessary for forming a flash memory after the buried bit lines and the STI structures are sequentially formed. In fact, a split gate structure consists of a first gate oxide layer, a first polysilicon layer, a second gate oxide layer and a second polysilicon layer arranged from bottom to top. In general, there are a number of methods for forming these gate oxide layers and polysilicon layers, and they should all be regarded as within the scope of this invention as long as the spirit is there.

In summary, one major aspect of this invention is the formation of a silicon dioxide line over each buried bit line by chemical vapor deposition so that the buried bit line is protected from subsequent trench-etching operation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a plurality of bit lines, gate structures and a gate oxide layer of a flash memory, comprising the steps of:

providing a silicon substrate having a pad oxide layer thereon;

forming a plurality of parallel silicon nitride lines over the pad oxide layer, wherein the silicon nitride lines have a plurality of openings that expose the pad oxide layer;

implanting ions through said openings and into the silicon substrate using the silicon nitride lines as a mask to form a plurality of bit lines;

depositing silicon dioxide to fill the openings and form a silicon dioxide layer that covers the bit lines;

forming a plurality of parallel photoresist lines perpendicular to the silicon nitride lines over the silicon nitride lines and silicon dioxide layer;

etching the silicon nitride lines, the pad oxide layer and the silicon substrate using the photoresist lines to form a plurality of trenches between the bit lines;

forming oxide plugs inside the trenches;

sequentially removing the silicon nitride lines and the pad oxide layer; and forming the gate oxide layer and the gate structures of the flash memory above the silicon substrate.

2. The method of claim 1, wherein the pad oxide layer has a thickness of about 110 Å.

3. The method of claim 1, wherein the silicon nitride line have a thickness of about 2000 Å.

4. The method of claim 1, wherein ions are implanted into the silicon substrate at an energy level of about 50 KeV.

5. The method of claim 1, wherein the ions implanted into the silicon substrate includes arsenic.

6. The method of claim 1, wherein the step of forming oxide plugs includes growing a liner oxide layer that conforms to an interior profile of the trenches and depositing silicon dioxide to fill the trenches completely.

7. The method of claim 6, wherein the step of depositing silicon dioxide to fill the trenches includes forming an atmospheric TEOS (AP-TEOS).

8. The method of claim 1, wherein the step of removing the silicon nitride lines and the pad oxide layer includes wet etching.

* * * * *